United States Patent
Ishida

(10) Patent No.: US 10,054,628 B2
(45) Date of Patent: Aug. 21, 2018

(54) IMAGE FORMING APPARATUS AND METHOD OF CONTROLLING IMAGE FORMING APPARATUS

(71) Applicant: KYOCERA Document Solutions Inc., Osaka (JP)

(72) Inventor: Takayuki Ishida, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 248 days.

(21) Appl. No.: 15/150,040

(22) Filed: May 9, 2016

(65) Prior Publication Data
US 2016/0334455 A1 Nov. 17, 2016

(30) Foreign Application Priority Data

May 11, 2015 (JP) ................. 2015-096543

(51) Int. Cl.
*G08B 21/00* (2006.01)
*G01R 31/04* (2006.01)
*H04N 1/00* (2006.01)

(52) U.S. Cl.
CPC ....... *G01R 31/045* (2013.01); *H04N 1/00885* (2013.01); *G01R 31/041* (2013.01)

(58) Field of Classification Search
CPC .................................................. G08B 21/00
USPC ............ 340/635, 653, 660; 324/508; 361/90
See application file for complete search history.

(56) References Cited

U.S. PATENT DOCUMENTS

| | | | | |
|---|---|---|---|---|
| 6,198,403 B1* | 3/2001 | Dorrough | .......... | G01R 19/2513 324/103 R |
| 6,734,682 B2* | 5/2004 | Tallman | ............... | G01R 31/025 324/528 |
| 7,164,273 B2* | 1/2007 | Bailey | ................ | G01R 19/2513 324/508 |
| 9,714,975 B2* | 7/2017 | Suica | ................... | G01R 31/041 |
| 2008/0042657 A1* | 2/2008 | Radle | ................... | G01R 31/045 324/508 |
| 2012/0268136 A1* | 10/2012 | Lee | ................. | G01R 19/16547 324/508 |

FOREIGN PATENT DOCUMENTS

JP 2012-255712 A 12/2012

* cited by examiner

*Primary Examiner* — Ryan Jager
(74) *Attorney, Agent, or Firm* — Stein IP, LLC

(57) ABSTRACT

An image forming apparatus includes a power supply connected to any one of L conductors of a three-phase four-wire alternating current power supply and to a neutral conductor of the three-phase four-wire alternating current power supply, a communication I/F unit connected to another apparatus via a cable, a determination circuit configured to output a determination signal indicating whether or not there is a miswired wall outlet, which includes the neutral conductor and a grounding conductor erroneously connected, in a building, and a control unit configured to display, on a display panel, a message on miswiring when it is identified that the miswired wall outlet is present based on the determination signal.

12 Claims, 6 Drawing Sheets

IMAGE FORMING APPARATUS AND METHOD OF CONTROLLING IMAGE FORMING APPARATUS

This application is based upon and claims the benefit of priority from the corresponding Japanese Patent Application No. 2015-096543 filed May 11, 2015, the entire contents of which are incorporated herein by reference.

BACKGROUND

The present disclosure relates to an image forming apparatus to be connected to a three-phase four-wire alternating current power supply, and a method of controlling the image forming apparatus.

When a building is newly constructed or renovated, indoor wiring works are performed. For example, when the wiring work of a single-phase three-wire system is performed, an L conductor, a neutral conductor, and a grounding conductor are connected to a wall outlet arranged in each room. However, there is a case in which erroneous wiring is performed during the wiring work (inappropriate conductors are connected to a terminal of a wall outlet).

The following exemplary tester is known that is configured to determine whether or not the wiring is erroneous. Specifically, a wiring check tester is known that involves, with respect to a wall outlet including a first terminal to which an L (line) conductor configured to supply a single-phase alternating current voltage at a first frequency is connected, a second terminal to which an N (neutral) conductor is to be connected, and a third terminal to which an E (earth) conductor is to be connected, passing a current including a second frequency different from the first frequency between the second terminal and the third terminal, measuring a voltage signal between the first terminal and the second terminal, measuring a voltage signal between the first terminal and the third terminal, and detecting a magnitude relationship between frequency components corresponding to the second frequency included in the respective measured voltage signals, to thereby determine whether or not the N conductor and the E conductor are erroneously wired.

In a three-phase four-wire alternating current power supply, a load is connected between an L conductor (voltage line, active line) routed from one end of a Y connecting wire (on secondary side of a transformer) and a neutral conductor connected to a neutral point of the Y connecting wire. A current that flows out of the L conductor returns via the neutral conductor. The three-phase four-wire electric power distribution is employed in various countries around the world, including the USA, China, and India.

There is a problem in that, even when an image forming apparatus is connected to a correctly wired wall outlet, erroneous wiring in some other wall outlet in the building may affect the image forming apparatus to cause a failure. This problem is described with reference to FIG. 7. FIG. 7 is an explanatory view for illustrating a failure that may occur in the image forming apparatus due to erroneous wiring.

Referring to FIG. 7, in a wall outlet to which an electrical appliance 700 is connected, a neutral conductor is connected to a terminal (receptacle) for a grounding conductor, and a grounding conductor is connected to a terminal (receptacle) for a neutral conductor. Thus, the wiring is incorrect. In other words, the electrical appliance 700 is connected to a wall outlet in which the grounding conductor and the neutral conductor are miswired. As illustrated in FIG. 7, the electrical appliance 700 is an apparatus that operates with electricity, such as an air conditioner (not necessarily an air conditioner). In the example illustrated in FIG. 7, the neutral conductor of the wall outlet for the electrical appliance 700 is connected to a grounding conductor of a wall outlet for an image forming apparatus 800. Further, referring to FIG. 7, the image forming apparatus 800 and a PC 900 are connected to correctly wired wall outlets (wall outlets without miswiring), respectively.

The image forming apparatus 800 is, for example, a multifunction peripheral or a printer. Further, as illustrated in FIG. 7, there is a case in which, for the purpose of sending print data from the PC 900 to the image forming apparatus 800, the image forming apparatus 800 and the PC 900 are communicably (electrically) connected to each other via a cable. It is often the case that an interface in accordance with the USB standard is used for the connection between the image forming apparatus 800 and the PC 900.

The electrical appliance 700 connected to the miswired wall outlet as illustrated in FIG. 7 passes, through the grounding conductor, an alternating current to be flowed through the neutral conductor. When the electrical appliance 700 passes the alternating current through the grounding conductor, the alternating current potential of the grounding conductor fluctuates. Such fluctuation causes a frame ground potential difference between appliances (in the example illustrated in FIG. 7, the image forming apparatus 800 and the PC 900) connected to wall outlets arranged in the same building. Further, although depending on structures of buildings, a grounding conductor generally has a higher impedance than a neutral conductor, and hence the frame ground potential difference may be too large to be disregarded.

As illustrated in FIG. 7, the image forming apparatus 800 and the PC 900 are connected via the cable. When a non-isolated interface circuit such as a USB is used for this connection, and there is a frame ground potential difference between the image forming apparatus 800 and the PC 900, an alternating current i0 flows through a ground line of the interface circuit or a ground line of the cable. Joule heat generated by the alternating current i0 increases the temperature of the interface circuit, with the result that a failure may occur in the interface circuit. The interface circuit is generally not designed to pass a large current therethrough. As described above, there is a problem in that, when a wall outlet, which includes the grounding conductor erroneously connected to the receptacle (terminal) for the neutral conductor and the neutral conductor erroneously connected to the receptacle (terminal) for the grounding conductor, is arranged in the building, a failure may occur in the interface circuit of the image forming apparatus due to an output current of an electrical appliance connected to the miswired wall outlet.

The related-art electric power distribution tester (voltage detector) described above can be used to determine whether or not the wiring in the wall outlet used for the connection is correct. However, the tester cannot determine whether or not any other miswired wall outlet is arranged in the building. Therefore, whether or not there is a miswired wall outlet that is not tested with the electric power distribution tester in the building cannot be determined, and thus, whether or not a failure of the interface circuit of the image forming apparatus occurs cannot be determined.

SUMMARY

An image forming apparatus according to one embodiment of the present disclosure includes a power supply, a communication I/F unit, a determination circuit, and a control unit. The power supply is connected to any one of L conductors of a three-phase four-wire alternating current power supply and to a neutral conductor of the three-phase four-wire alternating current power supply. The communication I/F unit is connected to another apparatus via a cable, and is configured to perform communication with the another apparatus. The determination circuit is configured to: determine whether or not there is a miswired wall outlet, which includes a grounding conductor connected to a terminal to which the neutral conductor is to be connected and the neutral conductor connected to a terminal to which the grounding conductor is to be connected, in a building based on voltage fluctuation of a frame ground; and output a determination signal representing a signal level corresponding to a result of the determination. The control unit is configured to: identify whether or not the miswired wall outlet is present based on the determination signal; and display, when it is identified that the miswired wall outlet is present, display a message on miswiring on a display panel.

A method of controlling an image forming apparatus according to another embodiment of the present disclosure includes: connecting any one of L conductors of a three-phase four-wire alternating current power supply and a neutral conductor of the three-phase four-wire alternating current power supply to a power supply of the image forming apparatus; connecting another apparatus and the image forming apparatus to each other via a cable to perform communication between the another apparatus and the image forming apparatus; determining whether or not there is a miswired wall outlet, which includes a grounding conductor connected to a terminal to which the neutral conductor is to be connected and the neutral conductor connected to a terminal to which the grounding conductor is to be connected, in a building based on voltage fluctuation of a frame ground; outputting a determination signal representing a signal level corresponding to a result of the determination; identifying whether or not the miswired wall outlet is present based on the determination signal; and displaying a message on miswiring when it is identified that the miswired wall outlet is present.

Further features and advantages of the present invention will become apparent from the description of embodiments given below.

DETAILED DESCRIPTION

According to the present disclosure, it is detected whether or not there is a miswired wall outlet, which includes a grounding conductor connected to a terminal for a neutral conductor and a neutral conductor connected to a terminal for a grounding conductor, in a building, thereby preventing occurrence of a failure of an image forming apparatus due to the miswired wall outlet. An embodiment of the present disclosure is described in the following with reference to FIG. 1 to FIG. 6. In the following description, a multifunction peripheral 100 is described as an example of the image forming apparatus. However, elements such as a structure and an arrangement that are described in this embodiment are mere examples and do not limit the scope of the present disclosure.

(Outline of Multifunction Peripheral 100)

The multifunction peripheral 100 according to this embodiment is now described with reference to FIG. 1.

Figure 1:
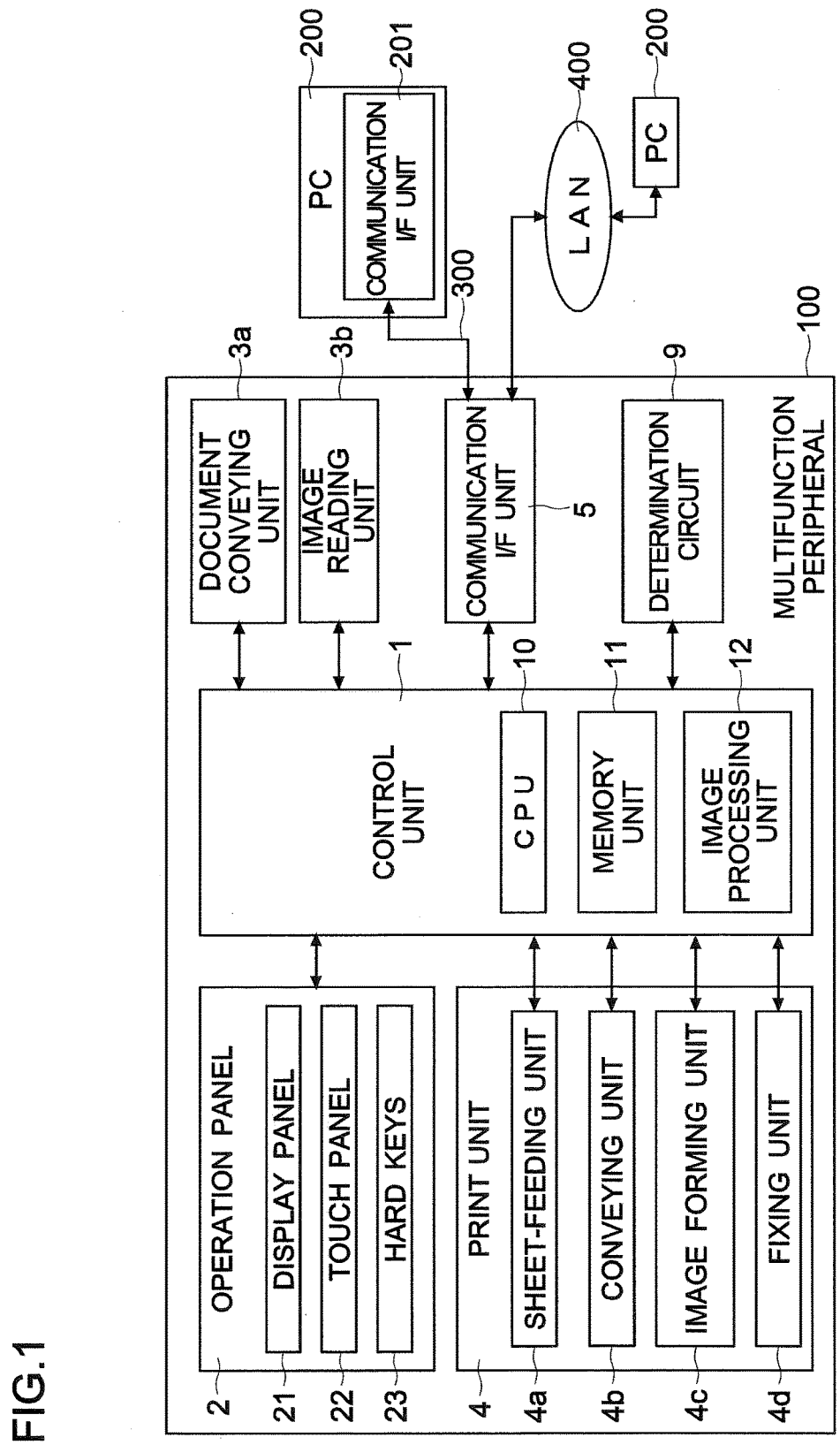
FIG. 1 is an illustration of an exemplary multifunction peripheral according to an embodiment of the present disclosure.

As illustrated in FIG. 1, the multifunction peripheral 100 includes a control unit 1. The control unit 1 controls operation of the multifunction peripheral 100. The control unit 1 includes a CPU 10, a memory unit 11, and an image processing unit 12. The memory unit 11 includes memory devices such as a ROM, a RAM, or a HDD. The memory unit 11 stores image data, control program, control data, or the like. The CPU 10 controls each unit of the multifunction peripheral 100 and performs various types of arithmetic processing based on the programs and data stored in the memory unit 11. The image processing unit 12 performs image processing to image data, which is to be printed or sent, such as density conversion, magnification, reduction, rotation, or data format conversion. The image data after being processed is used for toner image formation in an image forming unit 4c or for transmission.

As illustrated in FIG. 1, the multifunction peripheral 100 includes an operation panel 2. The operation panel 2 includes a display panel 21 configured to display a status of the multifunction peripheral 100, various messages, and various setting windows. Further, the display panel 21 includes a touch panel 22. Based on output of the touch panel 22, the control unit 1 identifies an operation image (an image of, for example, a soft key, a button, a tab, or a check box) touched by a user. Further, the operation panel 2 also includes a plurality of hard keys 23 such as a start key or numeric keys. The control unit 1 switches items displayed on the display panel 21 in response to a touch to an operation image or operation to a hard key 23.

The multifunction peripheral 100 includes a document conveying unit 3a and an image reading unit 3b. The document conveying unit 3a continuously and automatically conveys set documents one after another toward a feed-reading contact glass (reading position which is not shown). The image reading unit 3b reads a document that passes through the feed-reading contact glass or a document that is set on a placement reading contact glass (not shown) and generates image data. The control unit 1 is connected to the document conveying unit 3a and to the image reading unit 3b via signal lines such as a bus. The control unit 1 controls operation of the document conveying unit 3a and the image reading unit 3b during jobs such as copying, scanning, or sending.

The multifunction peripheral 100 includes a print unit 4 (sheet-feeding unit 4a, conveying unit 4b, image forming unit 4c, and fixing unit 4d) configured to perform printing. The sheet-feeding unit 4a accommodates a plurality of sheets, and, when printing is performed, feeds the sheets one after another to the conveying unit 4b. The conveying unit 4b conveys a sheet supplied from the sheet-feeding unit 4a to a discharge tray (not shown). The image forming unit 4c forms a toner image based on image data, and transfers the toner image onto a sheet that is conveyed. The fixing unit 4d fixes the toner image that is transferred onto the sheet. The sheet after the toner image fixation is discharged to the discharge tray. The control unit 1 is connected to the print unit 4 via a signal line such as a bus. The control unit 1 controls operation of the print unit 4 during a job accompanied with printing.

The multifunction peripheral 100 includes a communication I/F unit 5. The communication I/F unit 5 includes a communication circuit, a memory, and a connector 50 (see FIG. 3). The communication I/F unit 5 is communicably connected to a PC 200 via a cable 300. The PC 200 also includes a communication I/F unit 201 that conforms to the same standard with the communication I/F unit 5. A communication method that conforms to, for example, USB, HDMI, or IEEE1284 is used.

The communication I/F unit 5 receives print data from the PC 200 (communication I/F unit 201). The control unit 1 generates image data for forming a toner image based on the print data, and controls the print unit 4 to perform printing based on the generated image data (printer function). The communication I/F unit 5 (multifunction peripheral 100) and the PC 200 can be communicably connected to each other via a LAN 400 such as an in-house network. Further, the print data can be transmitted from the communication I/F unit 201 of the PC 200 to the communication I/F unit 5 via a network.

(Electric Power Supply to Multifunction Peripheral 100 by Three-Phase Four-Wire System)

Next, electric power supply to the multifunction peripheral 100 by the three-phase four-wire system is described with reference to FIG. 2.

The multifunction peripheral 100 receives electric power supply from a three-phase four-wire alternating current power supply P (commercial power supply). Specifically, the multifunction peripheral 100 is connected to a wall outlet 7, which conforms to a three-phase four-wire system, via a power cable 6 having a plug 61. The multifunction peripheral 100 operates with use of electric power supplied from the wall outlet 7. In FIG. 2, each of the wall outlets 7 arranged in the building is illustrated as a rectangle including three circles each representing a receptacle. Further, the plug 61 (power cable 6) on the multifunction peripheral 100 side is illustrated as a rectangle including three rectangles. Each of the three rectangles includes a name of a conductor to be connected thereto.

The multifunction peripheral 100 includes a power supply 8. The power supply 8 is configured to, for example, rectify current, raise voltage, or lower voltage, thereby generating a voltage necessary for the operation of the multifunction peripheral 100. For example, the power supply 8 generates a voltage for driving a circuit of, for example, 24 V, 5 V, 3.3 V, 2.5 V, or 1.8 V from a direct current for driving a motor.

Figure 2:
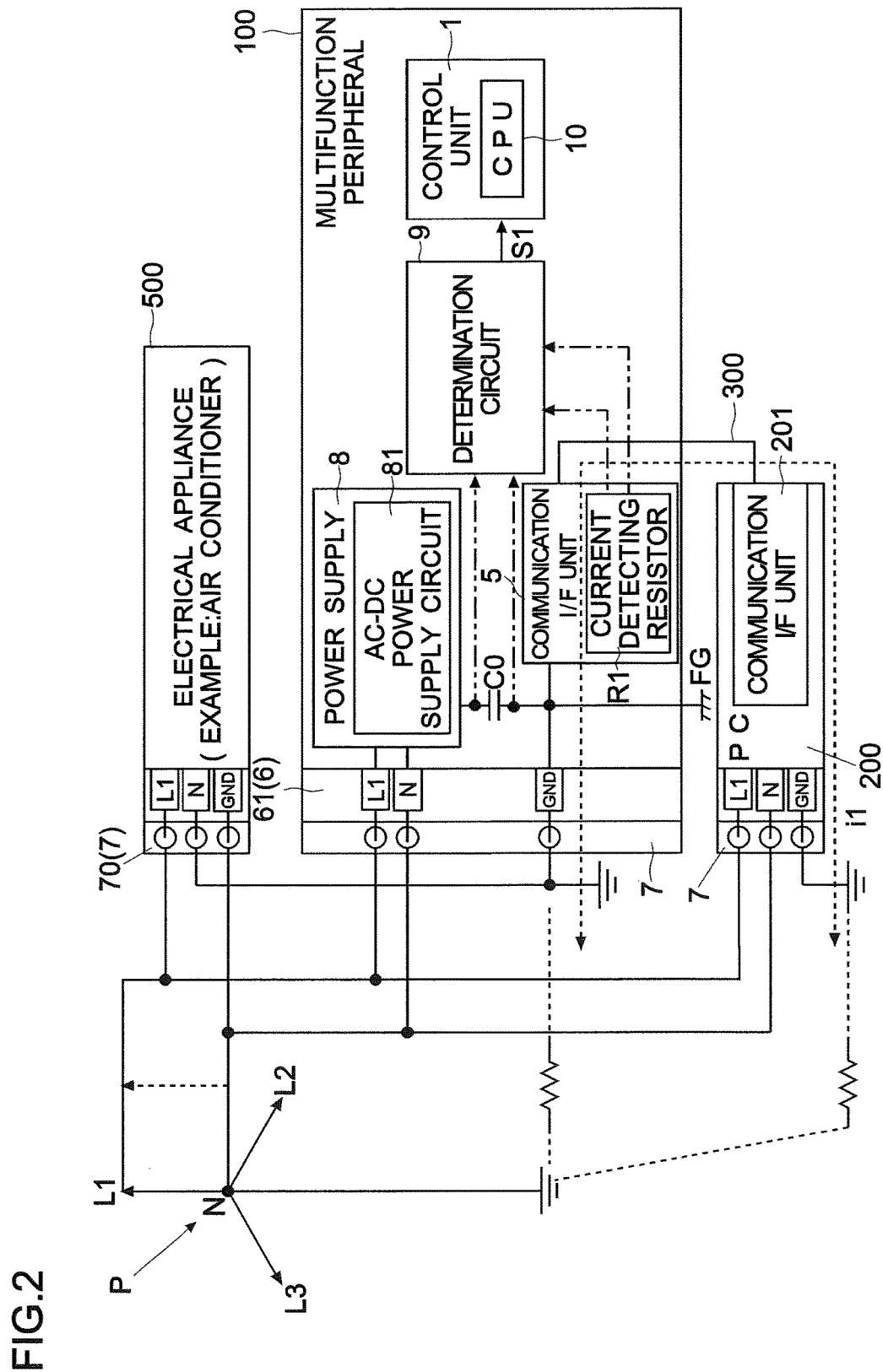
FIG. 2 is an illustration of exemplary electric power supply in a building in which the multifunction peripheral according to the embodiment is installed.

As illustrated in FIG. 2, the multifunction peripheral 100 includes, as a primary power supply, an isolated AC-DC power supply circuit 81. For example, the AC-DC power supply circuit 81 is a switched-mode power supply that includes a transformer and a switching element, and generates a voltage for driving the motor. The AC-DC power supply circuit 81 includes the transformer, and thus, a primary side (commercial power supply side) and a secondary side (output side) thereof are insulated from each other. The power supply 8 also includes a plurality of kinds of DC-DC converters (not shown). The power supply 8 lowers the voltage generated by the AC-DC power supply circuit 81 with the respective DC-DC converters to generate a plurality of kinds of voltages for driving the circuit. Further, the AC-DC power supply circuit 81 is grounded via a capacitor C0.

As illustrated in FIG. 2, the AC-DC power supply circuit 81 is connected to any one of L conductors of the three-phase four-wire alternating current power supply P (L1 in the example illustrated in FIG. 2) and to a neutral conductor via the wall outlet 7 and the plug 61 (power cable 6). When the AC-DC power supply circuit 81 operates, a current flows between L1 and the neutral conductor.

(Miswired Wall Outlet 70 and Influence of Miswiring)

Next, a wall outlet 7 with miswiring and the influence of the miswiring are described with reference to FIG. 2.

FIG. 2 is an illustration of an example in which an electrical appliance 500, the multifunction peripheral 100, and the PC 200 are respectively connected to three of wall outlets 7 arranged in a building (within the same facility, within the same housing). The electrical appliance 500 is not limited to an air conditioner exemplified in FIG. 2, and may be other electrical appliances of other kinds such as a washing machine or a cleaner.

In the example illustrated in FIG. 2, among the wall outlets 7 to which the electrical appliance 500, the multifunction peripheral 100, and the PC 200 are connected, respectively, the wall outlets 7 to which the multifunction peripheral 100 and the PC 200 are respectively connected are wall outlets 7 with correct wiring. Specifically, in each of the wall outlets 7 for the multifunction peripheral 100 and the PC 200, L1 of the three-phase four-wire alternating current power supply P is connected to a receptacle for a voltage line (active line). Further, in each of the wall outlets 7 for the multifunction peripheral 100 and the PC 200, a neutral conductor is connected to a receptacle for the neutral conductor. Still further, in each of the wall outlets 7 for the multifunction peripheral 100 and the PC 200, a receptacle for a grounding conductor is grounded. In other words, the wall outlets 7 to which the multifunction peripheral 100 and the PC 200 are respectively connected are wall outlets 7 with correct wiring.

In the example illustrated in FIG. 2, among the wall outlets 7 to which the electrical appliance 500, the multifunction peripheral 100, and the PC 200 are respectively connected, the wall outlet 7 to which the electrical appliance 500 is connected is a wall outlet 70 with miswiring. Specifically, in the wall outlet 7 for the electrical appliance 500, L1 of the three-phase four-wire alternating current power supply P is connected to the receptacle for a voltage line (active line). Therefore, L1 is normal. However, in the wall outlet 7 for the electrical appliance 500, the grounding conductor is connected to the receptacle for the neutral conductor, and the neutral conductor is connected to the receptacle for the grounding conductor. In other words, the grounding conductor and the neutral conductor are wired in reverse, and thus, the wall outlet 7 to which the electrical appliance 500 is connected is a miswired wall outlet 70.

Further, in the case illustrated in FIG. 2, for indoor wiring reasons, the grounding conductor of the wall outlet 7, which is the miswired wall outlet 70, is supposed to be first connected to the grounding conductor of the wall outlet 7 for the multifunction peripheral 100, and then grounded. Such wiring is performed, for example, when the wall outlets are located close to each other. In other words, the grounding position of the miswired wall outlet 70 to which the electrical appliance 500 is connected is the same as the grounding position of the wall outlet 7 to which the multifunction peripheral 100 is connected.

When there is miswiring in which the neutral conductor is connected to the receptacle for the grounding conductor, a current from the electrical appliance 500 connected to the miswired wall outlet 70 that is flowed through the neutral conductor flows into the ground. Although depending on structures of buildings, a grounding conductor often has a resistance value that is larger than that of a neutral conductor. Therefore, compared to a case of connection to the wall outlet 7 without miswiring, the electrical appliance 500 connected to the miswired wall outlet 70 fluctuates the ground potential more.

As illustrated in FIG. 2, it is often the case that the multifunction peripheral 100 and the PC 200 are electrically connected to each other via the communication cable 300 for the purpose of data transmission and reception. In the example illustrated in FIG. 2, the communication I/F unit 5 of the multifunction peripheral 100 and the communication I/F unit 201 of the PC 200 are connected to each other via the cable 300. When the multifunction peripheral 100 is used as a printer, print data is transmitted from the PC 200 to the multifunction peripheral 100. Further, there may be a case in which image data obtained by the reading operation of the image reading unit 3b is transmitted to the PC 200.

This cable communication is often performed in accordance with the USB standard. When the USB standard is employed, each of the communication I/F unit 5 of the multifunction peripheral 100 and the communication I/F unit 201 of the PC 200 includes a circuit and a member such as a controller and a connector conforming to the USB standard. Each of a memory included in the communication I/F unit 5 of the multifunction peripheral 100 and a memory included in the communication I/F unit 201 of the PC 200 stores communication data and programs in accordance with the USB standard. Further, the communication cable 300 conforming to the USB standard is connected to the communication I/F unit 5 and the communication I/F unit 201.

When the electrical appliance 500 connected to the miswired wall outlet 70 passes, through the ground (grounding conductor), a current to be flowed through the neutral conductor, a resistance component of the ground raises the voltage of the grounding conductor. A current that is passed by the miswired wall outlet 70 through the grounding conductor causes a potential difference between the ground of the multifunction peripheral 100 and the ground of the PC 200.

The multifunction peripheral 100 and the PC 200 are electrically connected to each other via the communication cable 300. When the communication I/F unit 5 and the communication I/F unit 201 are non-isolated interfaces such as USB, the potential difference of a frame ground FG causes an abnormal alternating current to flow through ground lines of the respective communication I/F units (a path of an abnormal alternating current i1 is indicated by the broken line in FIG. 2). The abnormal alternating current causes Joule heat to be generated by the resistance components of the respective communication I/F units.

When the multifunction peripheral 100 and the PC 200 are connected to each other via the cable 300, there is a possibility that the abnormal alternating current flows through the respective communication I/F units all the time while the electrical appliance 500 connected to the miswired wall outlet 70 is operating. Whether or not the multifunction peripheral 100 or the PC 200 is turned on is irrelevant. When the temperature of the resistance components in the respective communication I/F units is raised too much, the communication I/F unit 5 and the communication I/F unit 201 may be damaged. It is necessary to avoid such damage.

Therefore, a determination circuit 9 configured to determine whether or not there is a miswired wall outlet 70 is arranged in the multifunction peripheral 100. The determination circuit 9 determines whether or not there is a miswired wall outlet 70, which includes the grounding conductor connected to the terminal to which the neutral conductor is to be connected and the neutral conductor connected to the terminal to which the grounding conductor is to be connected, in the building. Then, the determination circuit 9 outputs a determination signal S1 representing a signal level corresponding to the result of the determination (details are described later).

(Voltage Used for Determination by Determination Circuit 9)

Figure 3:
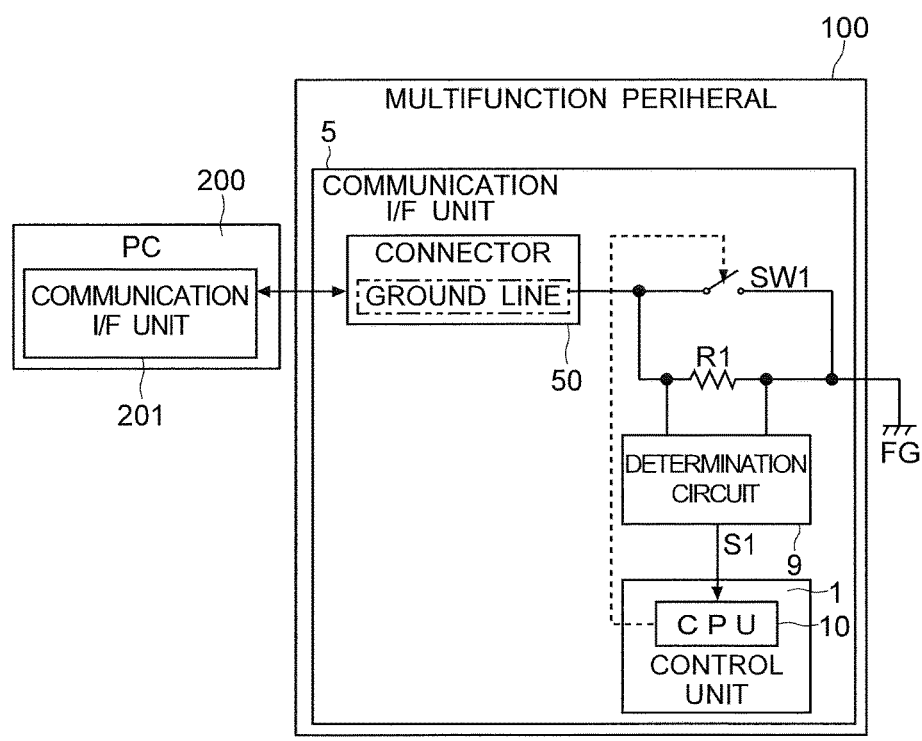
FIG. 3 is an illustration of an exemplary current detection resistor and an exemplary bypass switch circuit according to the embodiment.

Next, an exemplary voltage used for the determination by the determination circuit 9 according to this embodiment is described with reference to FIG. 2 and FIG. 3.

The determination circuit 9 of the multifunction peripheral 100 acquires a voltage between two predetermined points in the circuit of the multifunction peripheral 100 (measured voltage), between which the potential difference changes due to fluctuation of the frame ground FG, and determines whether or not there is a miswired wall outlet 70.

Specifically, a voltage (first measured voltage) across opposite ends of a current detection resistor R1 provided in the communication I/F unit 5 (between the two predetermined points) is used for the determination. Further, a voltage (second measured voltage) across opposite ends of the capacitor C0 (between the two predetermined points) connected between the AC-DC power supply circuit 81 and the frame ground FG may be used for the determination. In FIG. 2, the case is illustrated in which both the first measured voltage and the second measured voltage are input to the determination circuit 9. However, the determination circuit 9 can determine whether or not there is a miswired wall outlet 70 based on any one of the first measured voltage and the second measured voltage. Therefore, the voltage to be input to the determination circuit 9 may be any one of the first measured voltage and the second measured voltage.

<First Measured Voltage>

First, a case in which the determination circuit 9 makes a determination based on the voltage (first measured voltage) across the opposite ends of the current detection resistor R1 is described. In this case, the current detection resistor R1 is arranged in a circuit in the communication I/F unit 5 on a path of an alternating current that flows when there is a miswired wall outlet 70. Specifically, the current detection resistor R1 is arranged between the ground line (ground terminal) of the connector 50 of the communication I/F unit 5 and the frame ground FG (see FIG. 3). When a current to be flowed through the neutral conductor by a miswired wall outlet 70 flows through the grounding conductor, an alternating current flows through the current detection resistor R1. The determination circuit 9 makes a determination based on a voltage converted from the current that flows through the current detection resistor R1.

There is a possibility that the current continuously flows through the current detection resistor R1 while the electrical appliance 500 connected to the miswired wall outlet 70 is operating. It is necessary to prevent excessive temperature rise in the current detection resistor R1. Accordingly, as illustrated in FIG. 3, a bypass switch circuit SW1 is arranged in parallel with the current detection resistor R1. Specifically, the bypass switch circuit SW1 is arranged between the ground line (ground terminal) of the connector 50 of the communication I/F unit 5 and the frame ground FG in parallel with the current detection resistor R1.

The CPU 10 of the control unit 1 controls ON/OFF of the bypass switch circuit SW1. When the bypass switch circuit SW1 is turned on, the current flows through the bypass switch circuit SW1, and thus the current can be prevented from flowing through the current detection resistor R1. When the bypass switch circuit SW1 is turned off, the current is prevented from flowing through the bypass switch circuit SW1 but allowed to flow through the current detection resistor R1.

When it is determined whether or not there is a miswired wall outlet 70, the CPU 10 of the control unit 1 turns off the bypass switch circuit SW1. On the other hand, when it is determined that there is a miswired wall outlet 70, or during a period in which the determination of whether or not there is a miswired wall outlet 70 is not performed, for example, a period in which the communication I/F unit 5 of the multifunction peripheral 100 communicates with the communication I/F unit 201 of the PC 200, the control unit 1 turns on the bypass switch circuit SW1.

<Second Measured Voltage>

Next, a case in which the determination circuit 9 makes a determination based on the voltage (second measured voltage) across the opposite ends of the capacitor C0 connected between the AC-DC power supply circuit 81 and the frame ground FG is described (see FIG. 2). As described above, the power supply 8 includes the isolated AC-DC power supply circuit 81 configured to generate a direct current voltage based on the electric power from the three-phase four-wire alternating current power supply P. The capacitor C0 is arranged between (the secondary side of the transformer of) the AC-DC power supply circuit 81 and the frame ground FG. The capacitor C0 may have a function of stabilizing the potential of the AC-DC power supply circuit 81 and a function of letting a harmonic generated in the AC-DC power supply circuit 81 to escape to the ground.

The voltage across the opposite ends of the capacitor C0 is input to the determination circuit 9. When a miswired wall outlet 70 passes, through the grounding conductor, a current to be flowed through the neutral conductor, the potential of the ground of the multifunction peripheral 100 (frame ground FG) changes due to the resistance component of the grounding conductor. This change appears as a change in potential difference across the opposite ends of the capacitor C0. In this way, the determination circuit 9 outputs the determination signal S1 as to whether there is a miswired wall outlet 70 in the building based on (the fluctuation in) the potential difference across the opposite ends of the capacitor C0.

(Determination Circuit 9)

Next, an example of the determination circuit 9 according to this embodiment is described with reference to FIG. 4.

Figure 4:
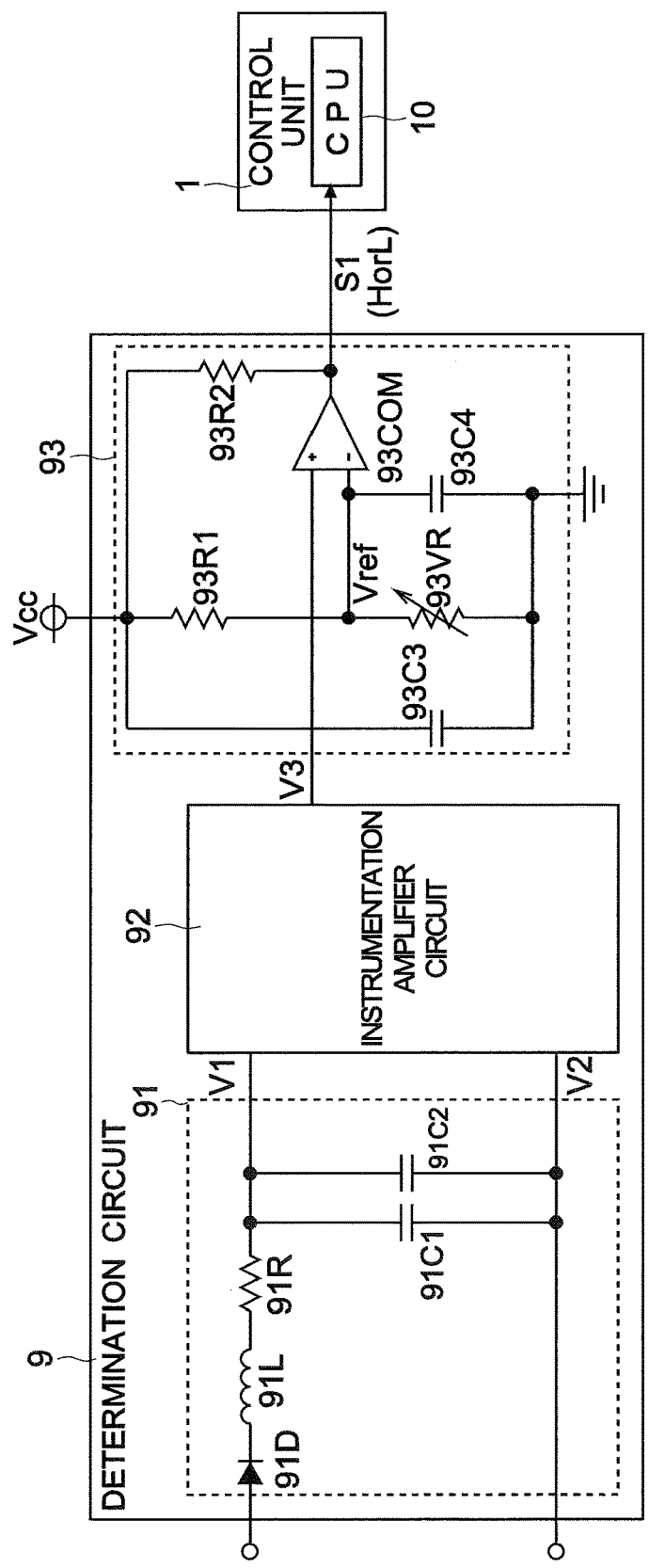
FIG. 4 is an illustration of an exemplary determination circuit according to the embodiment.

As illustrated in FIG. 4, the determination circuit 9 includes an input filter circuit 91, an instrumentation amplifier circuit 92, and a comparator circuit 93. The input filter circuit 91 includes a diode 91D, a coil 91L, a resistor 91R, and capacitors 91C1 and 91C2.

The diode 91D of the determination circuit 9 takes a half wave out of voltage fluctuation of the frame ground FG due to the alternating current that is passed through the grounding conductor by a miswired wall outlet 70. In other words, the diode 91D takes out a state in which a voltage is applied in a forward direction (half wave) to perform rectification. The coil 91L, the resistor 91R, the capacitor 91C1, and the capacitor 91C2 smooth the rectified voltage. As a magnitude of change in potential of the frame ground FG due to the current that is passed by a miswired wall outlet 70 to the ground (amplitude of the alternating current voltage) becomes larger, the potential difference between an output voltage V1 (smoothed voltage) and an output voltage V2 (voltage on the ground side) of the input filter circuit 91 becomes larger, and, as the magnitude of change becomes smaller, the potential difference becomes smaller.

When there is no voltage fluctuation of the frame ground FG due to a miswired wall outlet 70 (when there is no miswired wall outlet 70 in the building), the difference between the output voltage V1 and the output voltage V2 of the input filter circuit 91 is zero or almost zero. When a miswired wall outlet 70 passes an alternating current through the grounding conductor (when there is a miswired wall outlet 70 in the building), the difference between the output voltage V1 and the output voltage V2 of the input filter circuit 91 depends on the amplitude of the potential fluctuation.

The instrumentation amplifier circuit 92 is a circuit that includes two or three operational amplifiers (not shown) and a plurality of resistors. The instrumentation amplifier circuit 92 is a circuit configured to amplify the potential difference between the output voltage V1 and the output voltage V2 of the input filter circuit 91 and perform input/output impedance conversion. Further, the instrumentation amplifier circuit 92 also has a function of removing common noise. As the potential difference between the output voltage V1 and the output voltage V2 of the input filter circuit 91 becomes larger, an output voltage V3 of the instrumentation amplifier circuit 92 becomes larger, and, as the potential difference becomes smaller, the output voltage V3 becomes smaller. In other words, the value of the output voltage V3 of the instrumentation amplifier circuit 92 depends on the amplitude of the potential fluctuation of the ground.

The comparator circuit 93 includes a comparator 93COM, a capacitor 93C3, a capacitor 93C4, a resistor 93R1, a resistor 93R2, and a variable resistor 93VR. The output voltage V3 of the instrumentation amplifier circuit 92 is input to a (+) input terminal of the comparator 93COM. A reference voltage Vref is input to a (−) input terminal of the comparator 93COM. The comparator 93COM outputs the determination signal S1 that indicates whether or not there is a miswired wall outlet 70 in the building (whether or not the frame ground FG fluctuates due to a current passed through the grounding conductor by a miswired wall outlet 70). When the output voltage V3 of the instrumentation amplifier circuit 92 is higher than the reference voltage Vref, the comparator 93COM outputs HIGH as the determination signal S1. When the output voltage V3 of the instrumentation amplifier circuit 92 is lower than the reference voltage Vref, the comparator 93COM outputs LOW as the determination signal S1.

The reference voltage Vref is generated by a power supply Vcc, the resistor 93R1, and the variable resistor 93VR. The comparator circuit 93 includes a series circuit in which one end of the resistor 93R1 is connected to the power supply Vcc, the other end of the resistor 93R1 is connected to one end of the variable resistor 93VR, and the other end of the variable resistor 93VR is connected to the ground. A voltage value between the resistor 93R1 and the variable resistor 93VR (reference voltage Vref) depends on a ratio between the resistor 93R1 and the variable resistor 93VR. By changing the resistance value of the variable resistor, the magnitude of the reference voltage Vref can be adjusted.

The magnitude of the reference voltage Vref can be set as appropriate. For example, the value of the output voltage V3 of the instrumentation amplifier circuit 92 when noise is temporarily generated may be referred to, and the magnitude can be set so that the determination signal S1 does not become HIGH by fluctuation of the frame ground FG due to noise.

The determination signal S1 that is output by the comparator circuit 93 (comparator 93COM) is input to the control unit 1 (CPU 10). When the determination signal S1 is HIGH, the CPU 10 of the control unit 1 identifies that there is a miswired wall outlet 70 in the building. When the determination signal S1 is LOW, the CPU 10 of the control unit 1 identifies that there is no miswired wall outlet 70 in the building.

(Flow of Processing for Identifying Whether or not there is Miswired Wall Outlet 70)

Next, an exemplary flow of processing for identifying whether or not there is a miswired wall outlet 70 in the multifunction peripheral 100 according to this embodiment is described with reference to FIG. 5 and FIG. 6.

Figure 5:
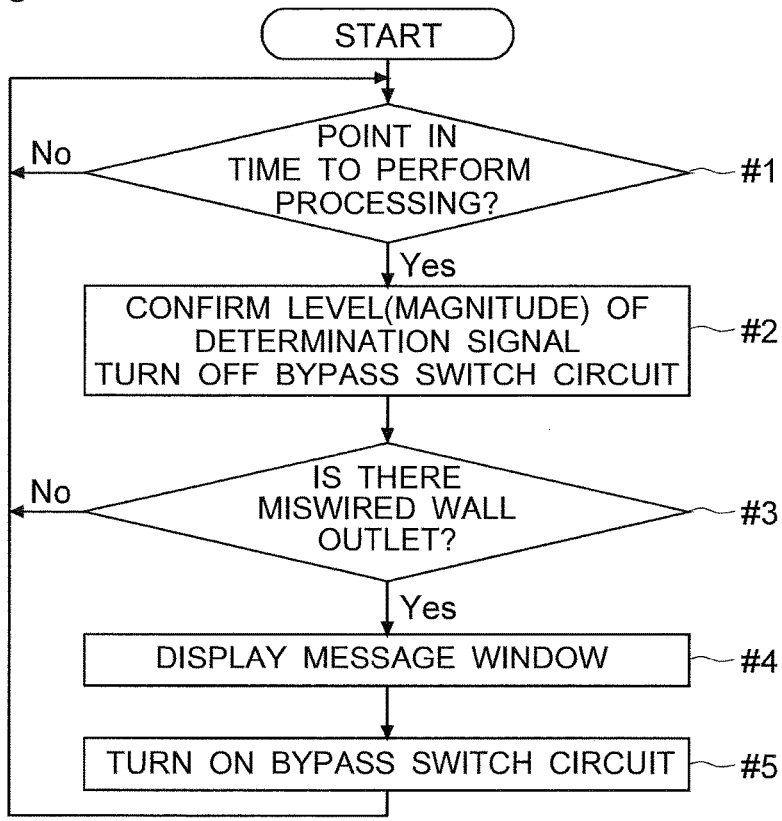
FIG. 5 is a flow chart for illustrating an exemplary flow of processing executed in the multifunction peripheral according to the embodiment to identify whether or not there is a miswired wall outlet.

The flow chart illustrated in FIG. 5 starts when a main power supply of the multifunction peripheral 100 is turned on or when the mode returns from a power-saving mode to a normal mode to trigger the operation of the control unit 1. The control unit 1 can execute the processing of the flow chart illustrated in FIG. 5 except for a period in which electric power supply to the control unit 1 is partly or entirely stopped as in the power-saving mode.

The control unit 1 continues to confirm whether or not this is a point in time at which the processing for identifying whether or not there is a miswired wall outlet 70 is to be performed (Step #1, and No in Step #1 and back to Step #1). The multifunction peripheral 100 is configured not to perform the identification processing while the multifunction peripheral 100 executes a job such as copying, scanning, transmitting, or printing. During execution of a job, electric power consumed by the multifunction peripheral 100 increases. Therefore, the multifunction peripheral 100 itself may allow fluctuation of the potentials of the neutral conductor and the frame ground FG during execution of a job. That the multifunction peripheral 100 is not executing a job can be a condition for starting the identification processing.

In a configuration in which the communication I/F unit 5 includes the current detection resistor R1 and the determination circuit 9 makes a determination based on the first measured voltage, the identification processing is prevented from being performed during data communication between the communication I/F unit 5 and the PC 200 or pieces of equipment connected to the communication I/F unit 5 other than the PC 200. In performing the identification processing, the control unit 1 does not allow the communication I/F unit 5 to perform communication. The control unit 1 may control the communication I/F unit 5 to give a command to stop communication for a predetermined length of time to the communication I/F unit 201 of the PC 200. The reason is that a current generated due to the data communication may flow through the current detection resistor R1, which may be a cause of erroneous determination that there is a miswired wall outlet 70. In other words, that the communication I/F unit 5 is not performing data communication or that the data communication amount of the communication I/F unit 5 per unit time is equal to or less than a predetermined limit may be a condition for starting the identification processing.

Further, for the purpose of reducing the number of execution of the identification processing to reduce the load of processing by the control unit 1, a predetermined length of time may be secured between the immediately preceding identification processing to the next identification processing. The predetermined length of time may be set as appropriate, such as a day, several minutes, several tens of minutes, several hours, over ten hours, or a week. The predetermined length of time can be set to be zero, and the control unit 1 can repeat the identification processing. The control unit 1 executes the identification processing after the predetermined length of time passes from the immediately preceding identification processing (from the identification of whether or not there is a miswired wall outlet 70 based on the determination signal S1).

When this is a point in time at which the processing for identifying whether or not there is a miswired wall outlet 70 is to be performed (Yes in Step #1), the control unit 1 confirms the level (magnitude) of the determination signal S1 (Step #2). When the determination circuit 9 makes a determination based on the first measured voltage, the control unit 1 turns off the bypass switch circuit SW1 for protecting the current detection resistor R1 and energizes the current detection resistor R1 (Step #2). When the determination circuit 9 determines that there is a miswired wall outlet 70, the determination circuit 9 outputs HIGH. When the determination circuit 9 determines that there is no miswired wall outlet 70, the determination circuit 9 outputs LOW. The control unit 1 identifies whether the determination signal S1 is HIGH or LOW to identify whether or not there is a miswired wall outlet 70 (Step #3).

When the level of the determination signal S1 is LOW and the control unit 1 identifies that there is no miswired wall outlet 70 (No in Step #3), the flow returns to Step #1. On the other hand, when the level of the determination signal S1 is HIGH, and the control unit 1 identifies that there is a miswired wall outlet 70 (Yes in Step #3), the control unit 1 displays a message window S2 on the display panel 21 (Step #4).

Figure 6:
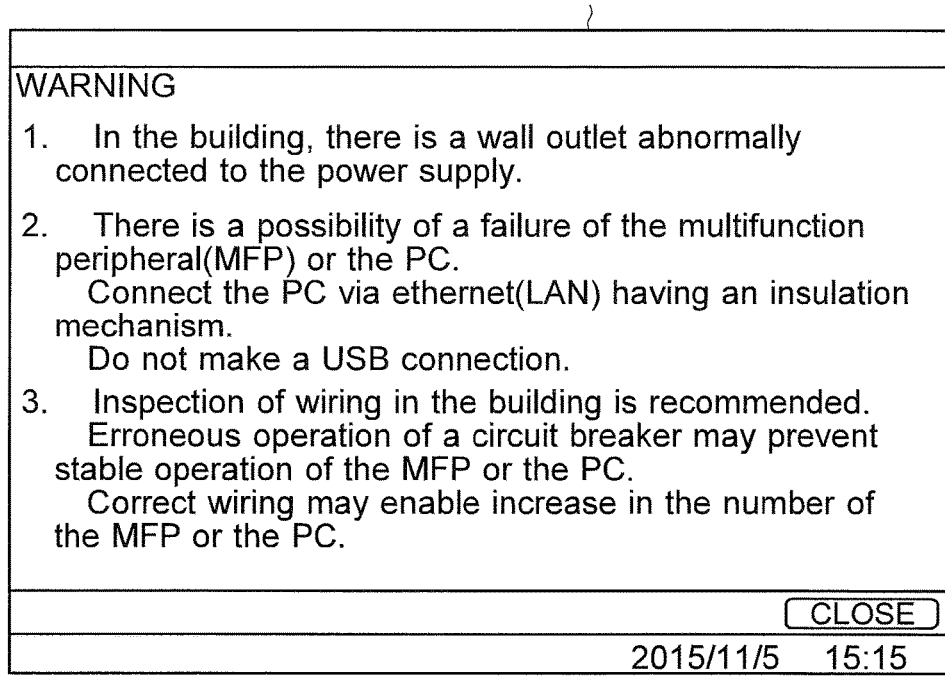
FIG. 6 is an illustration of an exemplary message window displayed on a display panel of the multifunction peripheral according to the embodiment.
Figure 7:
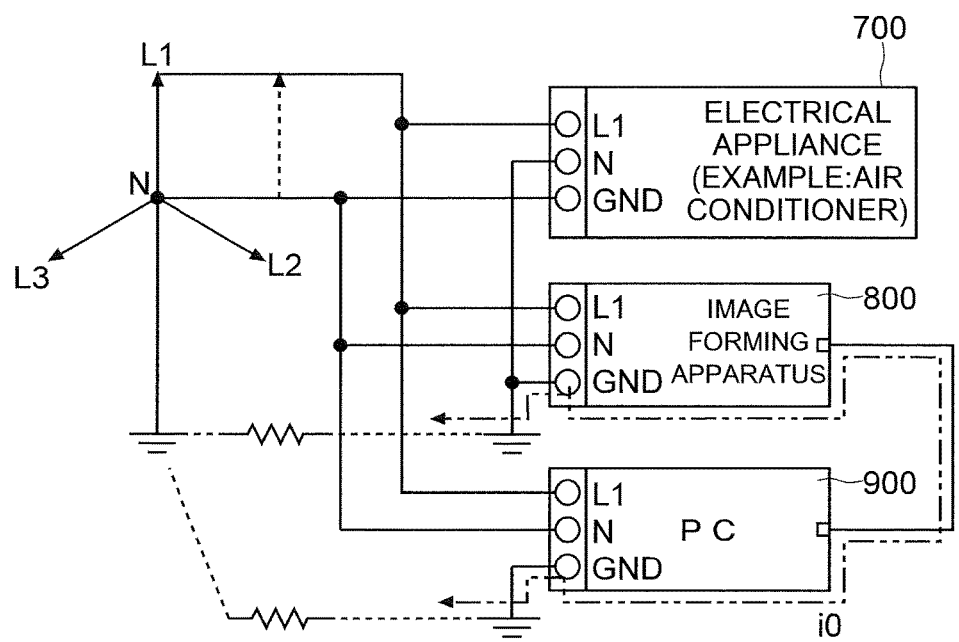
FIG. 7 is an explanatory view for illustrating a failure that occurs in an image forming apparatus due to miswiring.

FIG. 6 is an illustration of an exemplary message window S2. The message window S2 is a window that displays a message on miswiring of the wall outlet 7. Various kinds of messages can be displayed in the message window S2.

As illustrated in FIG. 6, the control unit 1 may display a message on the display panel 21 to inform a user that there is a miswired wall outlet 70, which includes the grounding conductor connected to the terminal (receptacle) for the neutral conductor and the neutral conductor connected to the terminal (receptacle) for the grounding conductor, in the building (within the same facility, within the same housing).

Further, the control unit 1 may display, on the display panel 21, a message informing that there is a possibility of a failure of the multifunction peripheral 100 or the PC 200, a message on a recommended communication method, or a message on a communication method that should not be used, as a message on miswiring.

Further, the control unit 1 may display, on the display panel 21, any one or all of a message indicating that wiring in the building is required to be inspected, a message indicating that there is a possibility of erroneous operation of an indoor wiring device such as a circuit breaker due to the miswired wall outlet 70, a message indicating that there is a possibility of unstable operation of an apparatus such as the multifunction peripheral 100 due to the miswired wall outlet 70, and a message indicating that correct wiring may enable increase in the number of the multifunction peripheral 100 and the PC 200 to be installed, as a message on miswiring.

Further, when the communication I/F unit 5 includes the current detection resistor R1 so that the determination circuit 9 may make a determination based on the first measured voltage, the control unit 1 turns on the bypass switch circuit SW1 for protecting the current detection resistor R1 and does not allow a current to flow through the current detection resistor R1 (Step #5). Then, the flow returns to Step #1.

As described above, the image forming apparatus according to this embodiment (multifunction peripheral 100) includes the power supply 8 that is connected to any one of the L conductors of the three-phase four-wire alternating current power supply P and to a neutral conductor of the three-phase four-wire alternating current power supply P, the communication I/F unit 5 that is connected to another apparatus via the cable 300, and is configured to perform communication with the another apparatus, the determination circuit 9 configured to: determine whether or not there is a miswired wall outlet 70, which is a wall outlet 7 with miswiring and includes the grounding conductor connected to the terminal to which the neutral conductor is to be connected and the neutral conductor connected to the terminal to which the grounding conductor is to be connected, in the building based on voltage fluctuation of the frame ground FG; and output the determination signal S1 representing a signal level corresponding to the result of the determination, and the control unit 1 configured to: identify whether or not there is a miswired wall outlet 70 based on the determination signal S1; and display, when it is identified that there is a miswired wall outlet 70, a message on miswiring on the display panel.

This enables identification of whether or not there is a miswired wall outlet 70, which includes the neutral conductor connected to the terminal (receptacle) for the grounding conductor and the grounding conductor connected to the terminal (receptacle) for the neutral conductor, in a building that employs the three-phase four-wire electric power distribution. Whether or not there is a possibility of a failure due to a current flowing through the miswired wall outlet 70 can be determined by the circuit of the communication I/F unit 5. Further, a user can be informed that there is a miswired wall outlet 70 in the building. This enables the user to have an opportunity to solve abnormality of electric power distribution equipment (electrical equipment) in the building. Further, erroneous operation of an electric power distribution member such as a circuit breaker may occur due to the miswiring in the building, and, as a result, there is a case in which the number of the electrical appliances 500 such as the multifunction peripheral 100 and a computer to be installed is smaller than that when all the wall outlets 7 are correctly wired. However, erroneous electric wiring in the building can be corrected, and thus, there is a case in which the number of the electrical appliances 500 to be installed can be increased.

The image forming apparatus (multifunction peripheral 100) includes the current detection resistor R1 that is arranged between the ground line of the connector 50 of the communication I/F unit 5 and the frame ground FG. The determination circuit 9 generates the determination signal S1 through measurement of a potential difference across the opposite ends of the current detection resistor R1. The voltage at a place at which a failure occurs due to a current that flows from the miswired wall outlet 70 into the ground is directly measured, and thus, whether or not there is a miswired wall outlet 70 in the building can be accurately determined.

When a current passes through a resistor, heat is generated. On the other hand, generally, in the field of light electric appliances such as a communication interface, it is not assumed to continue to pass a large current for a long time. It is not preferred that a current continuously flow through the current detection resistor R1 while the electrical appliance 500 connected to the miswired wall outlet 70 is operating.

Therefore, the image forming apparatus (multifunction peripheral 100) includes, between the ground line of the connector 50 of the communication I/F unit 5 and the frame ground FG, the bypass switch circuit SW1 arranged in parallel with the current detection resistor R1. During a period in which it is determined whether or not there is a miswired wall outlet 70, the control unit 1 turns off the bypass switch circuit SW1 so that a current is allowed to flow through the current detection resistor R1 but prevented from flowing through the bypass switch circuit SW1. During a period in which it is not determined whether or not there is a miswired wall outlet 70 based on the determination signal S1, the control unit turns on the bypass switch circuit SW1 so that a current is prevented from flowing through the current detection resistor R1 but allowed to flow through the bypass switch circuit SW1.

This makes it possible to pass a current through the current detection resistor R1 only during a period in which it is determined whether or not there is a miswired wall outlet 70. Therefore, a current can be prevented from being passed through the current detection resistor R1 as much as possible, and a failure of the current detection resistor R1 due to abnormal temperature rise can be avoided. Further, a current can be prevented from flowing through the current detection resistor R1 while the electrical appliance 500 connected to the miswired wall outlet 70 is operating or while the image forming apparatus (multifunction peripheral 100) is executing a job.

The power supply 8 includes the isolated AC-DC power supply circuit 81 configured to generate a direct current voltage based on electric power from the three-phase four-wire alternating current power supply P, and the capacitor C0 arranged between the AC-DC power supply circuit 81 and the frame ground FG. The determination circuit 9 may generate the determination signal S1 through measurement of a potential difference across the opposite ends of the capacitor C0. In this case, a voltage across the capacitor C0 that is arranged between the isolated AC-DC power supply circuit 81 and the frame ground FG is measured. As a result, a voltage corresponding to change in the frame ground FG can be input to the determination circuit 9. Further, based on the amount of change (magnitude of change) in potential of the frame ground FG, whether or not there is a miswired wall outlet 70 can be correctly determined.

Further, the determination circuit 9 includes the input filter circuit 91 configured to take a half wave out of the measured potential difference, perform rectification, and smooth the rectified voltage, the instrumentation amplifier circuit 92 configured to amplify an output of the input filter circuit 91, and the comparator circuit 93 configured to compare an output voltage of the instrumentation amplifier circuit 92 and the reference voltage Vref, output, as the determination signal S1, a signal at a level indicating that there is a miswired wall outlet 70 when the output voltage of the instrumentation amplifier circuit 92 is higher than the reference voltage Vref, and output, as the determination signal S1, a signal at a level indicating that there is no miswired wall outlet 70 when the output voltage of the instrumentation amplifier circuit 92 is equal to or lower than the reference voltage Vref. This enables measurement of voltage change due to voltage fluctuation of the frame ground FG at the measurement point to generate the determination signal S1. Therefore, whether or not there is a miswired wall outlet 70 in the building can be accurately determined.

There is a case in which operation of the image forming apparatus (multifunction peripheral 100) causes the potentials of the frame ground FG and of the neutral conductor to fluctuate. Therefore, the control unit 1 is configured to perform operation other than identifying whether or not there is a miswired wall outlet 70 based on the determination signal S1 when the image forming apparatus is executing a job. This can prevent erroneous determination that there is a miswired wall outlet 70 due to a current that flows through the operating image forming apparatus.

The embodiments of the present disclosure have been described, but the scope of the present disclosure is not limited thereto. The present disclosure may be implemented by making various modifications thereto without departing from the gist of the present disclosure.

What is claimed is:

1. An image forming apparatus, comprising:
    a power supply that is connected to any one of L conductors of a three-phase four-wire alternating current power supply and to a neutral conductor of the three-phase four-wire alternating current power supply;
    a communication I/F unit that is connected via a cable to another apparatus, provided with a communication interface and is configured to perform with the another apparatus conforming to a same standard;
    a determination circuit configured to:
        determine whether or not there is a miswired wall outlet, which includes a grounding conductor connected to a terminal to which the neutral conductor is to be connected and the neutral conductor connected to a terminal to which the grounding conductor is to be connected, in a building based on voltage fluctuation of a frame ground; and
        output a determination signal representing a signal level corresponding to a result of the determination, and
    a control unit configured to:
        identify whether or not the miswired wall outlet is present based on the determination signal, and
        display, when it is identified that the miswired wall outlet is present, a message on miswiring on a display panel;
    a current detection resistor that is arranged between a ground line of a connector of the communication I/F unit and the frame ground; and
    a bypass switch circuit that is arranged between the ground line of the connector of the communication I/F unit and the frame ground so as to be in parallel with the current detection resistor,
    wherein the control unit is further configured to:
        during a period in which it is determined whether or not the miswired wall outlet is present, turn off the bypass switch circuit so that a current is allowed to flow through the current detection resistor prevented from flowing through the bypass switch circuit, and
        during a period in which it is not determined whether or not the miswired wall outlet is present based on the determination signal, turn on the bypass switch circuit so that a current is prevented from flowing through the current detection resistor but allowed to flow through the bypass switch circuit.

2. The image forming apparatus according to claim 1, wherein the control unit is configured to perform operation other than identifying whether or not the miswired wall outlet is present based on the determination signal when the image forming apparatus is executing a job.

3. The image forming apparatus according to claim 1, wherein the control unit is configured to execute identification processing after a predetermined time passes from immediately preceding identification processing of whether or not the miswired wall outlet is present.

4. The image forming apparatus according to claim 1, wherein the control unit is configured to display, as a message on miswiring, on the display panel, at least one of a message that there is a possibility of a failure of the image forming apparatus, a message on a recommended communication method, a message on a communication method that is unsuitable, a message that there is a possibility of erroneous operation of an indoor wiring device due to the miswired wall outlet, a message that there is a possibility of unstable operation of the image forming apparatus due to the miswired wall outlet, and a message that correct wiring may enable increase in a number of image forming apparatus and PCs to be installed.

5. An image forming apparatus, comprising:
    a power supply that is connected to any one of L conductors of a three-phase four-wire alternating current power supply and to a neutral conductor of the three-phase four-wire alternating current power supply;
    a communication I/F unit that is connected via a cable to another apparatus, provided with a communication interface and is configured to perform with the another apparatus conforming to a same standard;
    a determination circuit configured to:
        determine whether or not there is a miswired wall outlet, which includes a grounding conductor connected to a terminal to which the neutral conductor is to be connected and the neutral conductor connected to a terminal to which the grounding conductor is to be connected, in a building based on voltage fluctuation of a frame ground, and
        output a determination signal representing a signal level corresponding to a result of the determination, and
    a control unit configured to:
        identify whether or not the miswired wall outlet is present based on the determination signal, and
        display, when it is identified that the miswired wall outlet is present, a message on miswiring on a display panel;
    wherein the power supply comprises:
        an isolated AC-DC power supply circuit configured to generate a direct current voltage based on electric power from the three-phase four-wire alternating current power supply; and
        a capacitor arranged between the AC-DC power supply circuit and the frame ground, and
    wherein the determination circuit is configured to generate the determination signal through measurement of a potential difference across opposite ends of the capacitor.

6. The image forming apparatus according to claim 5, wherein the control unit is configured to perform operation other than identifying whether or not the miswired wall outlet is present based on the determination signal when the image forming apparatus is executing a job.

7. The image forming apparatus according to claim 5, wherein the control unit is configured to execute identification processing after a predetermined time passes from immediately preceding identification processing of whether or not the miswired wall outlet is present.

8. The image forming apparatus according to claim 5, wherein the control unit is configured to display, as a message on miswiring, on the display panel, at least one of a message that there is a possibility of a failure of the image forming apparatus, a message on a recommended communication method, a message on a communication method that is unsuitable, a message that there is a possibility of erroneous operation of an indoor wiring device due to the miswired wall outlet, a message that there is a possibility of unstable operation of the image forming apparatus due to the miswired wall outlet, and a message that correct wiring may enable increase in a number of image forming apparatus and PCs to be installed.

9. An image forming apparatus, comprising:
  a power supply that is connected to any one of L conductors of a three-phase four-wire alternating current power supply and to a neutral conductor of the three-phase four-wire alternating current power supply;
  a communication I/F unit that is connected via a cable to another apparatus, provided with a communication interface and is configured to perform with the another apparatus conforming to a same standard;
  a determination circuit configured to:
    determine whether or not there is a miswired wall outlet, which includes a grounding conductor connected to a terminal to which the neutral conductor is to be connected and the neutral conductor connected to a terminal to which the grounding conductor is to be connected, in a building based on voltage fluctuation of a frame ground, and
    output a determination signal representing a signal level corresponding to a result of the determination, and
  a control unit configured to:
    identify whether or not the miswired wall outlet is present based on the determination signal, and
    display, when it is identified that the miswired wall outlet is present, a message on miswiring on a display panel;
  wherein the determination circuit comprises:
    an input filter circuit configured to take a half wave out of the measured potential difference, perform rectification, and smooth the rectified voltage,
    an instrumentation amplifier circuit configured to amplify an output of the input filter circuit; and
    a comparator circuit configured to:
      compare an output voltage of the instrumentation amplifier circuit and a reference voltage,
      output, as the determination signal, a signal at a level indicating that the miswired wall outlet is present when the output voltage of the instrumentation amplifier circuit is higher than the reference voltage, and
      output, as the determination signal, a signal at a level indicating that the miswired wall outlet is absent when the output voltage of the instrumentation amplifier circuit is equal to or lower than the reference voltage.

10. The image forming apparatus according to claim 9, wherein the control unit is configured to perform operation other than identifying whether or not the miswired wall outlet is present based on the determination signal when the image forming apparatus is executing a job.

11. The image forming apparatus according to claim 9, wherein the control unit is configured to execute identification processing after a predetermined time passes from immediately preceding identification processing of whether or not the miswired wall outlet is present.

12. The image forming apparatus according to claim 9, wherein the control unit is configured to display, as a message on miswiring, on the display panel, at least one of a message that there is a possibility of a failure of the image forming apparatus, a message on a recommended communication method, a message on a communication method that is unsuitable, a message that there is a possibility of erroneous operation of an indoor wiring device due to the miswired wall outlet, a message that there is a possibility of unstable operation of the image forming apparatus due to the miswired wall outlet, and a message that correct wiring may enable increase in a number of image forming apparatus and PCs to be installed.

\* \* \* \* \*